(12) United States Patent
Nakata et al.

(10) Patent No.: US 8,400,182 B2
(45) Date of Patent: Mar. 19, 2013

(54) WAFER INSPECTION DEVICE AND SEMICONDUCTOR WAFER INSPECTION METHOD USING THE SAME

(75) Inventors: Yoshirou Nakata, Tokyo (JP); Satoshi Sasaki, Chiba (JP)

(73) Assignee: Panasonic Corporation, Osaka (JP)

( * ) Notice: Subject to any disclaimer, the term of this patent is extended or adjusted under 35 U.S.C. 154(b) by 297 days.

(21) Appl. No.: 12/839,778

(22) Filed: Jul. 20, 2010

(65) Prior Publication Data

US 2011/0095780 A1 Apr. 28, 2011

(30) Foreign Application Priority Data

Oct. 23, 2009 (JP) ................................ 2009-244046

(51) Int. Cl.
*G01R 31/02* (2006.01)
(52) U.S. Cl. ..................... 324/762.05; 324/761; 324/754
(58) Field of Classification Search ............. 324/762.05, 324/761, 754
See application file for complete search history.

(56) References Cited

U.S. PATENT DOCUMENTS

| | | | |
|---|---|---|---|
| 5,945,834 A | 8/1999 | Nakata et al. | |
| 6,791,347 B2 * | 9/2004 | Ishizaka et al. | .......... 324/750.05 |
| 2003/0218474 A1 | 11/2003 | Sanada | |
| 2007/0269997 A1 * | 11/2007 | Eldridge et al. | ................ 439/66 |
| 2008/0018355 A1 | 1/2008 | Takekoshi et al. | |
| 2008/0100319 A1 * | 5/2008 | Aghababazadeh et al. | ... 324/754 |
| 2008/0116910 A1 * | 5/2008 | Hung | ............................ 324/754 |
| 2008/0143365 A1 | 6/2008 | Kiesewetter et al. | |
| 2009/0072848 A1 * | 3/2009 | Eldridge | ........................ 324/754 |
| 2011/0074455 A1 * | 3/2011 | Nakata et al. | ............ 324/754.03 |

FOREIGN PATENT DOCUMENTS

| | | |
|---|---|---|
| JP | 08-005666 | 1/1996 |
| JP | 2003-059986 | 2/2003 |

OTHER PUBLICATIONS

N. Salles et al., "Reinforcement of PCB using Advanced Stiffeners for High Pin Count Devices," IEEE Semiconductor Wafer Test Workshop 2007, Session 4-2, Jun. 2007.
S. Wijeyesekera et al., "One Touch 300mm Wafer Probing," IEEE Semiconductor Wafer Test, Workshop 2006, Session 5-2, Jun. 2006.

* cited by examiner

*Primary Examiner* — Huy Q Phan
*Assistant Examiner* — Temilade S Rhodes-Vivour
(74) *Attorney, Agent, or Firm* — McDermott Will & Emery LLP

(57) ABSTRACT

A wafer inspection device, which inspects the electrical properties of a semiconductor wafer on which a semiconductor integrated circuit is formed, and the wafer inspection device has: a holding mechanism for holding a probe card; a wafer stage that holds the semiconductor wafer on the upper surface and is movably provided; and a pressing mechanism that are held and press the wafer stage against the probe card. The wafer stage is provided on the outer periphery with a seal ring. The seal ring forms a sealed space in a state where the wafer and the probe card are brought close to each other by contacting the probe card and is provided in such a manner as to reduce the pressure of the sealed space.

3 Claims, 8 Drawing Sheets

WAFER INSPECTION DEVICE AND SEMICONDUCTOR WAFER INSPECTION METHOD USING THE SAME

CROSS-REFERENCE TO RELATED APPLICATION

This application claims priority to Japanese Patent Application No. 2009-244046 filed on Oct. 23, 2009, the disclosure of which including the specification, the drawings, and the claims is hereby incorporated by reference in its entirety.

BACKGROUND

The present invention relates to a wafer inspection device that performs electrical inspection of a wafer on which a plurality of semiconductor integrated circuit devices are formed and a semiconductor wafer inspection method using the same. In particular, the present invention relates to a wafer inspection device that performs electrical inspection by pressing a probe card for inspection against a wafer and a semiconductor wafer inspection method using the same.

During manufacturing of a semiconductor integrated circuit, a plurality of semiconductor integrated devices (chips) are simultaneously formed through a diffusion process performed to a semiconductor wafer. However, in the manufacturing process, all the plurality of chips simultaneously manufactured are usually difficult to be made non-defective articles due to various factors, such as dust. Therefore, the plurality of chips simultaneously manufactured on a wafer need to be individually inspected in a wafer level whether or not each chip is non-defective before the chips are separated and assembled. For the inspection, a probe card having a contact terminal to be electrically connected to one or a plurality of chips on a wafer and an inspection device, referred to as a prober, that conveys the wafer, aligns the same with the probe card, and then presses the wafer against the probe card are used (Japanese Patent Publication No. 2003-59986).

In recent years, due to an improvement of a device for performing electrical inspection, referred to as a tester, that generates a power supply or electrical signals, transmits the power supply and the signals to a wafer, and processes the signals returned from the wafer, a larger number of semiconductor chips can be inspected at once and a probe card for collectively and simultaneously inspecting wafers has also been increasingly supplied.

However, with an increase in the number of chips to be simultaneously inspected, a higher force for pressing a wafer against a probe card is required. The pressing force is obtained by rotating a ball screw by a stepping motor or the like, and there is a limitation in the force with a single mechanism. In usual, 2 to 4 stepping motors are provided, but there is a limitation in increasing the number of the stepping motors also in terms of an area for providing the same. The probe card to be pressed is required to maintain the degree of flatness with a reinforcing plate in such a manner as not to be curved by the pressing force (e.g., Nicolas Salles, Wayne Nelson, "Reinforcement of PCB using Advanced Stiffeners for High Pin Count Devices" IEEE Semiconductor Wafer Test Workshop 2007, Session 4-2, June, 2007, Internet <URL:http://www.swtest.org/swtw_library/2007 proc/PDF/S04_02_Salles_SWTW2007.pdf>. Moreover, with an increase in the number of chips to be simultaneously inspected, the area of the contact terminal of a probe card inevitably increases, and thus the degree of parallelism of the probe card and the wafer is also important. When the degree of parallelism thereof fluctuates, so-called uneven contact makes it difficult to achieve uniform contact on the entire surface (e.g., Sunil Wijeyesekera, Makarand Shinde, "One Touch 300 mm Wafer Probing" IEEE Semiconductor Wafer Test Workshop 2006, Session 5-2, June, 2006, Internet <URL:http://www.swtest.org/swtw_library/2006 proc/PDF/S05_01_Wijeyesekera.pdf>. As a method for solving the problem, a method for obtaining a load value by a differential pressure with the atmospheric pressure using a wafer tray is disclosed in Japanese Patent Publication No. 08-5666.

SUMMARY

However, according the method including pressing a probe card against a semiconductor wafer by a differential pressure with the atmospheric pressure using a former wafer tray, it becomes difficult to obtain a pressing force of 100 kPa or more which is the differential pressure between the atmospheric pressure and vacuum. When a wafer stage (wafer chuck) is brought close to a probe card, the interval between the wafer and the probe card becomes small, thus, the pressure of a sealed space increases, and a seal ring forming the sealed space is pushed out. Thus, a thin film substrate (membrane) forming a probe card and provided with a contact terminal is pushed out in the outer circumferential direction, which causes a problem in that the contact terminal on the thin film substrate causes position shift between the contact terminal and the wafer.

Therefore, it is required to, for example, limit the number of electrodes of the contact terminal to be brought into contact with the wafer or gradually bring the wafer close to the probe card while reducing a rate of bringing the wafer close to the probe card and reducing the pressure inside the sealed space.

In view of the above-described problems, it is an object of the present invention to achieve pressing a probe card to a wafer by a pressing force equal to or higher than the atmospheric pressure and promptly pressing the wafer into contact with the probe card.

In order to achieve the above-described object, the present invention constitutes a wafer inspection device to have a structure such that a sealed space is formed between a wafer holding table and a probe card by a seal ring provided in the outer periphery of the wafer stage and the pressure of the formed sealed space is reduced comparing with the atmospheric pressure.

Specifically, a first wafer inspection device according to the present invention is directed to a wafer inspection device that inspects the electrical properties of a semiconductor wafer on which a semiconductor integrated circuit is formed, and the first wafer inspection device has: a holding mechanism for holding a probe card that performs electrical inspection for the semiconductor wafer; a wafer stage that holds the semiconductor wafer on the upper surface and is movably provided; and a pressing mechanism that aligns the probe card and the semiconductor wafer that are held and press the wafer stage against the probe card, in which, the wafer stage is provided on the outer periphery with a seal ring that forms a sealed space between the wafer stage and the probe card; and the seal ring forms the sealed space in a state where the wafer and the probe card are brought close to each other by contacting the probe card and is provided in such a manner as to reduce the pressure of the sealed space.

According to the first wafer inspection device, by reducing the pressure of the sealed space formed by the wafer stage, the seal ring provided on the outer periphery of the wafer stage, and the probe card, the probe card can be certainly pressed against the semiconductor wafer due to a differential pressure with the atmospheric pressure.

In the first wafer inspection device, the wafer stage preferably has a pressing force of 100 kg or higher.

Thus, in addition to the load due to the differential pressure with the atmospheric pressure, a pressing force by the wafer stage is also added, and thus the probe card can be pressed against the semiconductor wafer with a higher load.

In the first wafer inspection device, the seal ring is preferably movably provided on the wafer stage in a direction perpendicular to the principal surface of the probe card.

Thus, bringing the semiconductor wafer close to the probe card, the formation of the sealed space, the reduction in the pressure of the sealed space can be individually performed at an independent timing. Thus, the pressing force due to the differential pressure with the atmospheric pressure can be more rapidly obtained. The load force of the wafer stage in this case may be a load force sufficient for bringing the semiconductor wafer close to the probe card.

In this case, the movable range of the seal ring may be in the range of a position spaced apart in the direction toward the side opposite to the probe card relative to the semiconductor wafer and a position closer to the probe card than the semiconductor wafer in the wafer stage.

Thus, during alignment of the probe card and the semiconductor wafer, the seal ring can be prevented from interfering with a sensor for measuring the height of the semiconductor wafer, a camera for detecting the position of a pad electrode formed on the semiconductor wafer, or the like.

In the first wafer inspection device, the seal ring may be movably provided according to the inclination of the principal surface of the probe card and may be movably provided also in a direction perpendicular to the principal surface of the probe card in such a manner as to be adhered to the probe card due to the differential pressure between the pressure of the sealed space and the atmospheric pressure of the outside of the sealed space by reducing the pressure of the sealed space.

Thus, even when the probe card is held with slight inclination, the sealed space can be formed without difficulty and, when the sealed space is formed, the pressure of the sealed space can be prevented from increasing due to bringing the semiconductor wafer close to the probe card. In addition, since it moves to the optimal position with the reduction in the pressure, alignment shift due to forced pressing in an uneven contact state and an increase in the internal pressure can be prevented and a pressing force can be rapidly obtained.

The first wafer inspection device further has a wafer tray removably provided on the wafer stage, in which the seal ring may be returnably provided at a position spaced apart from the probe card on the wafer stage.

Thus, after the completion of the alignment of the probe card and the semiconductor wafer, the semiconductor wafer that is aligned with the probe card can be moved with the wafer tray to another inspection device, and another inspection can be performed. Therefore, not only that the inspection can be carried out on a higher-functional temperature adjustment system but also that the operating ratio of the inspection device can be increased.

A second wafer inspection device according to the present invention is directed to a wafer inspection device that inspects the electrical properties of a semiconductor wafer on which a semiconductor integrated circuit is formed using a probe card, in which the probe card has a thin film substrate on which an electrode for contact and a non-contact probe pattern using capacitive coupling or inductive coupling are formed and is formed so that the pressure of a first sealed space constituted by mutually facing surfaces of the probe card and the thin film substrate can be controlled; and the second wafer inspection device has: a wafer stage that holds the semiconductor wafer on the upper surface and is movably provided; and a mechanism for aligning the probe card and the semiconductor wafer, in which, the wafer stage is provided on the outer periphery with a seal ring that forms a second sealed space between the thin film substrate and the semiconductor wafer by bringing the semiconductor wafer close to the probe card or pressing the semiconductor wafer close against the probe card; and the pressure of the first sealed space and the pressure of the second sealed space can be independently reduced.

According to the second wafer inspection device, also when a probe card having a thin film substrate on which a non-contact probe pattern using capacitive coupling or an inductive coupling is formed is used as the probe card, the probe card can be certainly pressed against the semiconductor wafer by a differential pressure of the atmospheric pressure.

The second wafer inspection device may further have a pressure short-circuiting switch mechanism that makes the pressure of the first sealed space and the pressure of the second sealed space the same; and a plurality of pressure control valves that independently control each of the first sealed space and second sealed space.

In this case, among the plurality of the pressure control valves, the pressure control valve connected to the first sealed space may control the pressure of the first sealed space in such a manner as to make the pressure of the first sealed space and the pressure of the second sealed space different from each other.

A semiconductor wafer inspection method according to the present invention is directed to a semiconductor wafer inspection method for inspecting the electrical properties of a semiconductor wafer on which a semiconductor integrated circuit is formed using a probe card, and the semiconductor wafer inspection method includes the steps of: (a) holding the semiconductor wafer on a wafer stage; (b) aligning each electrode of the semiconductor wafer and the probe card after the step (a); (c) bringing the semiconductor wafer close to the probe card or pressing the semiconductor wafer against the probe card after the step (b); (d) bringing a seal ring provided on the outer periphery of the wafer stage into contact with the wafer stage in or after the step (c) to form a sealed space defined by at least the probe card, the upper surface of the wafer stage, and the seal ring; and (e) reducing the pressure of the sealed space after the step (d).

According to the semiconductor wafer inspection method of the present invention, due to a differential pressure with the atmospheric pressure generated by reducing the pressure of the sealed space formed by the wafer stage, the seal ring provided on the outer periphery of the wafer stage, and the probe card, the probe card can be certainly pressed against the semiconductor wafer.

As described above, according to the wafer inspection device according to the present invention and the semiconductor wafer inspection method using the same, when electrical inspection of the semiconductor wafer is performed using the probe card having a contact terminal, the probe card can be pressed against the semiconductor wafer with a pressing force equal to or higher than the atmospheric pressure without causing position shift and the semiconductor wafer and the probe card can be rapidly pressed into contact with each other.

DETAILED DESCRIPTION

First Example Embodiment

A wafer inspection device according to a first example embodiment will be described with reference to FIG. 1.

Figure 1:
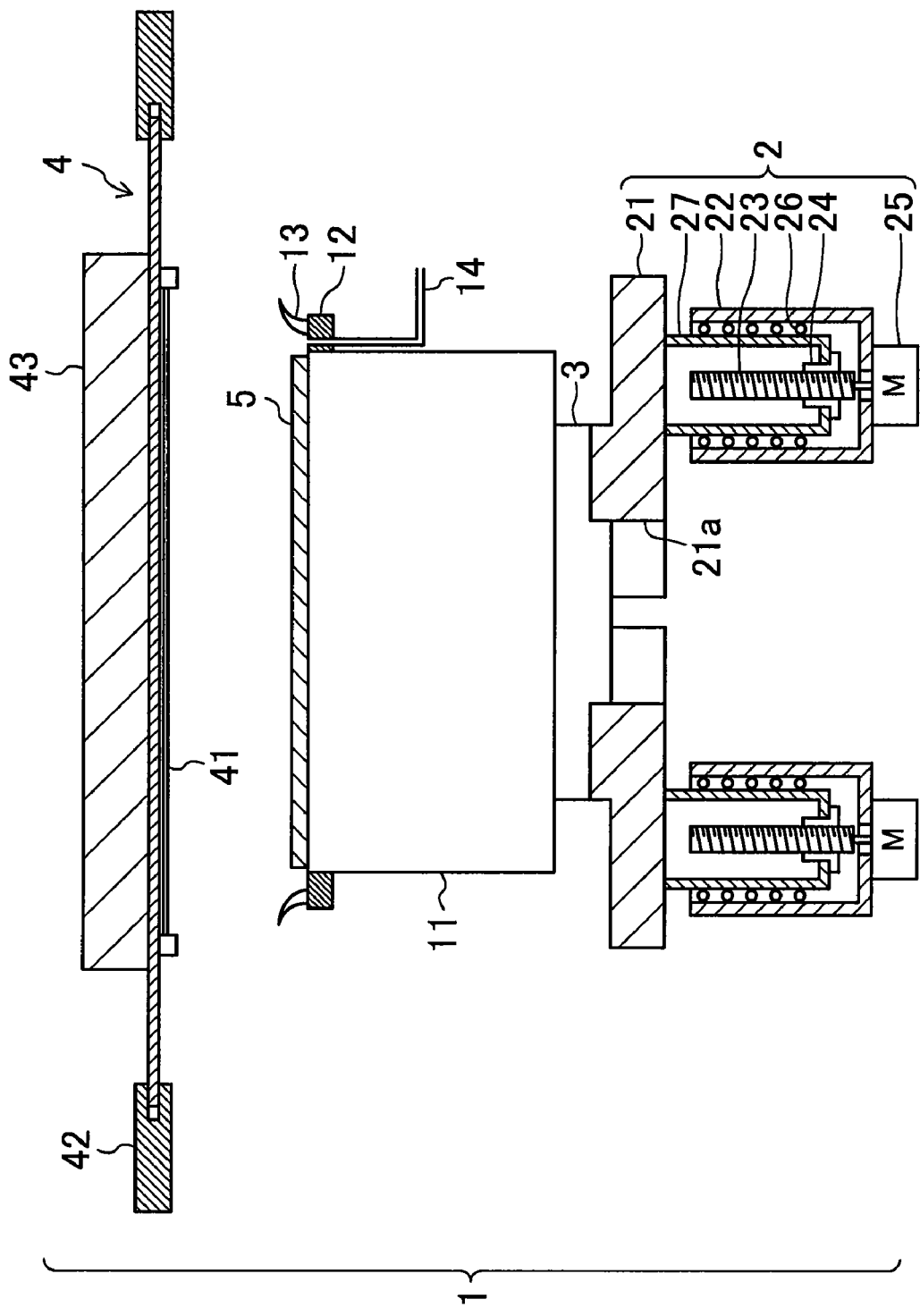
FIG. 1 is a schematic cross sectional view of a wafer holding portion of a wafer inspection device according to a first example embodiment.

As shown in FIG. 1, a wafer inspection device 1 according to the first example embodiment has a wafer stage 11, an annular seal ring holding member 12 provided on the upper portion of the wafer stage 11 and on the outer periphery thereof and containing a rigid material, and a seal ring 13 formed on the seal ring holding member 12 and containing an elastic material.

The seal ring holding member 12 is provided with an internal pressure regulating pipe 14 penetrating in the front-to-back direction and a pressure regulating valve (not shown) for regulating the internal pressure is connected to the end opposite to the seal ring holding member 12 in the pressure regulating pipe 14.

The wafer stage 11 is fixed on a pressing mechanism 2 with a screw or the like and is placed on a stage (not shown) movably provided in the XY direction. The pressing mechanism 2 contains a moving unit 21, a guiding unit 22, a ball screw 23, a nut 24, a motor unit 25, a ball bearing 26, and the like. The moving unit 21 connected to the wafer stage 11 through an intermediate member 3 and removably fixed with a bolt or the like is formed in a circular shape in which a ring-shaped hollow portion 21a is formed at the center. From the undersurface of the moving unit 21, a cylindrical member 27 accommodating the ball screw 23 is downwardly and vertically formed. The number of the cylindrical members 27 are two or more and preferably two to four, and the cylindrical members 27 are provided at the same interval in the circumferential direction of the moving unit 21. Thus, the wafer stage 11 can be prevented from vertically moving and from inclining due to an uneven contact pressure during the inspection. In the cylindrical member 27, the ball screw 23 connected to the motor unit 25 by a belt or coupling is accommodated and the nut 24 provided at the lower end portion of the cylindrical member 27 is engaged with the ball screw 23.

On the outer periphery of the cylindrical member 27, the guiding unit 22 having a cylindrical shape is provided and the ball bearing 26 is disposed between the cylindrical member 27 and the guiding unit 22. Thus, the ball screw 23 rotates by driving the motor unit 25 which is a pulse motor, and the cylindrical member 27 to which the nut 24 is attached is guided by the guiding unit 22 and vertically moves. Here, the moving unit 21 to which the cylindrical member 27 is fixed and the wafer stage 11 vertically move. Two or more of the motor units 25 are driven in a synchronized manner. The two or more of the motor units 25 may be driven in a synchronized manner by connecting one motor by a belt and rotating the ball screw 23.

The wafer inspection device 1 containing the wafer stage 11 has a probe card holding mechanism 42, to which the probe card 4 can be attached and held.

The seal ring holding member 12 is preferably formed with a material having a small heat capacity and a low thermal conductivity, such as zirconia (zirconium oxide). Thus, when the temperature of the wafer 5 is adjusted through the wafer stage 11, the heat resistance of the whole wafer stage 11 is not increased and the heat capacity is not increased. The seal ring holding member 12 may be adhered to the wafer stage 11 to seal the space therebetween. For example, it is preferable that the seal ring holding member 12 be removably assembled and the space with the wafer stage 11 be sealed with an O ring or the like so that the air does not leak.

For materials forming the seal ring 13, fluorine rubber materials are preferably used instead of silicone rubber generating silicon oxide compounds, such as siloxane. Thus, when the sealed space formed by the wafer stage 11, the probe card 4, and the seal ring 13 is opened, the seal ring 13 adheres to the probe card 4 to avoid various problems. The cross sectional shape of the seal ring 13 in the direction perpendicular to the upper surface of the wafer stage 11 is preferably a shape in which a blade spreads outside, i.e., a bellows type. Thus, the tip portion of the blade is pressed against the probe card 4 by the differential pressure between the pressure of the sealed space and the atmospheric pressure of the outside thereof, and the sealing properties of the seal ring 13 increase.

The probe card 4 may be reinforced by a reinforcing plate 43 or the like in order to maintaining the degree of flatness and prevent distortion due to the pressing force of the pressing mechanism 2.

With the structures, the wafer stage 11 is aligned with the plurality of the contact terminals 41 formed on the probe card 4 after placing the wafer 5, and then can be pressed against the probe card 4.

Figure 2:
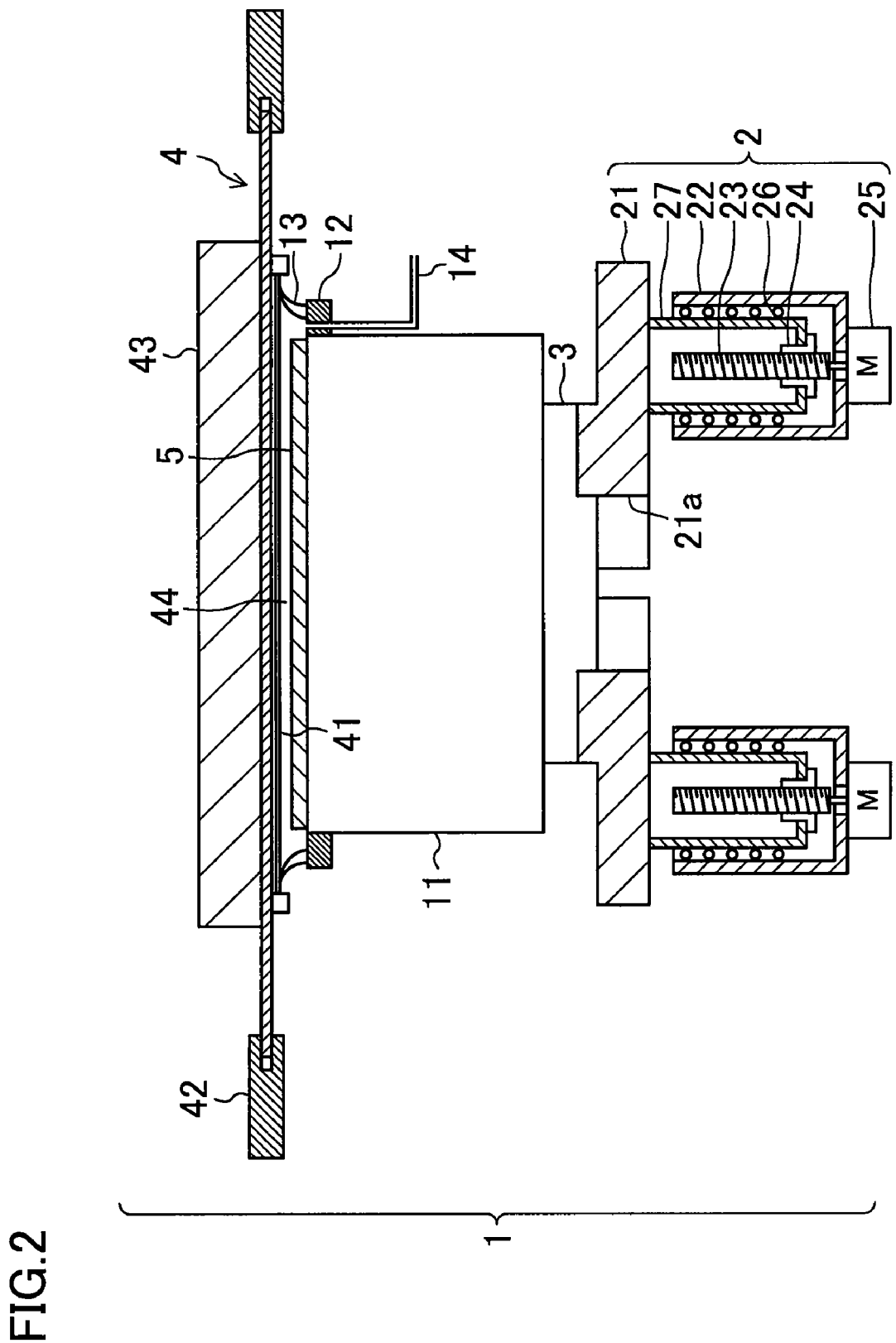
FIG. 2 is a schematic cross sectional view of a state where a sealed space is formed between a probe card and a wafer, which is the wafer holding portion of the wafer inspection device according to the first example embodiment.

Thus, as shown in FIG. 2, the sealed space 44 is formed by the wafer stage 11, the seal ring 13 provided on the outer periphery of the wafer stage 11, and the probe card 4. By reducing the pressure of the formed sealed space 44 through the internal pressure regulating pipe 14, the probe card 4 is pressed against the wafer 5 with a higher force by the differential pressure between the pressure of the sealed space 44 and the atmospheric pressure of the outside thereof.

In usual, with respect to the pressing force by the pressing mechanism 2, a pressing force of from 100 kg to about 400 kg can be obtained with a wafer prober having a diameter of 300 mm. In addition thereto, when the differential pressure with the atmospheric pressure is used, a pressing force of 700 kg or higher can be obtained similarly using the wafer having a diameter of 300 mm. This is determined by multiplying the differential pressure (100 kPa) when the inside of the sealed space 44 is exhausted by the area (150 mm×150 mm×π (the ratio of the circumference of a circle to its diameter) of the diameter of 300 mm of the wafer 5. Accordingly, a load of about 800 kg to about 1100 kg in total can be obtained. Supposing that the contact terminal 41 can achieve electrical contact with an aluminum electrode on the wafer 5 with a load of 2.5 g, the load indicates that electrodes with about 440,000 terminals can be simultaneously electrically connected to the wafer 5.

As described above, according to the first example embodiment, since the pressure of the sealed space 44 between the probe card 4 and the wafer stage 11 formed by the seal ring holding member 12 provided on the upper portion of the wafer stage 11 and the outer periphery thereof and the seal ring 13 provided on the upper surface of the seal ring holding member 12 is reduced, the probe card 4 can be pressed against the wafer 5 with a pressing force equal to or higher than the atmospheric pressure, and it is prevented that the pressure of the sealed space 44 increases to push out the seal ring 13 for forming the sealed space 44. As a result, since the contact terminal 41 formed on the probe card 4 is not pushed out in the outer circumferential direction, the position shift particularly between the contact terminal formed on the peripheral portion of the probe card 4 and the electrode formed on the wafer 5.

Second Example Embodiment

Figure 3:
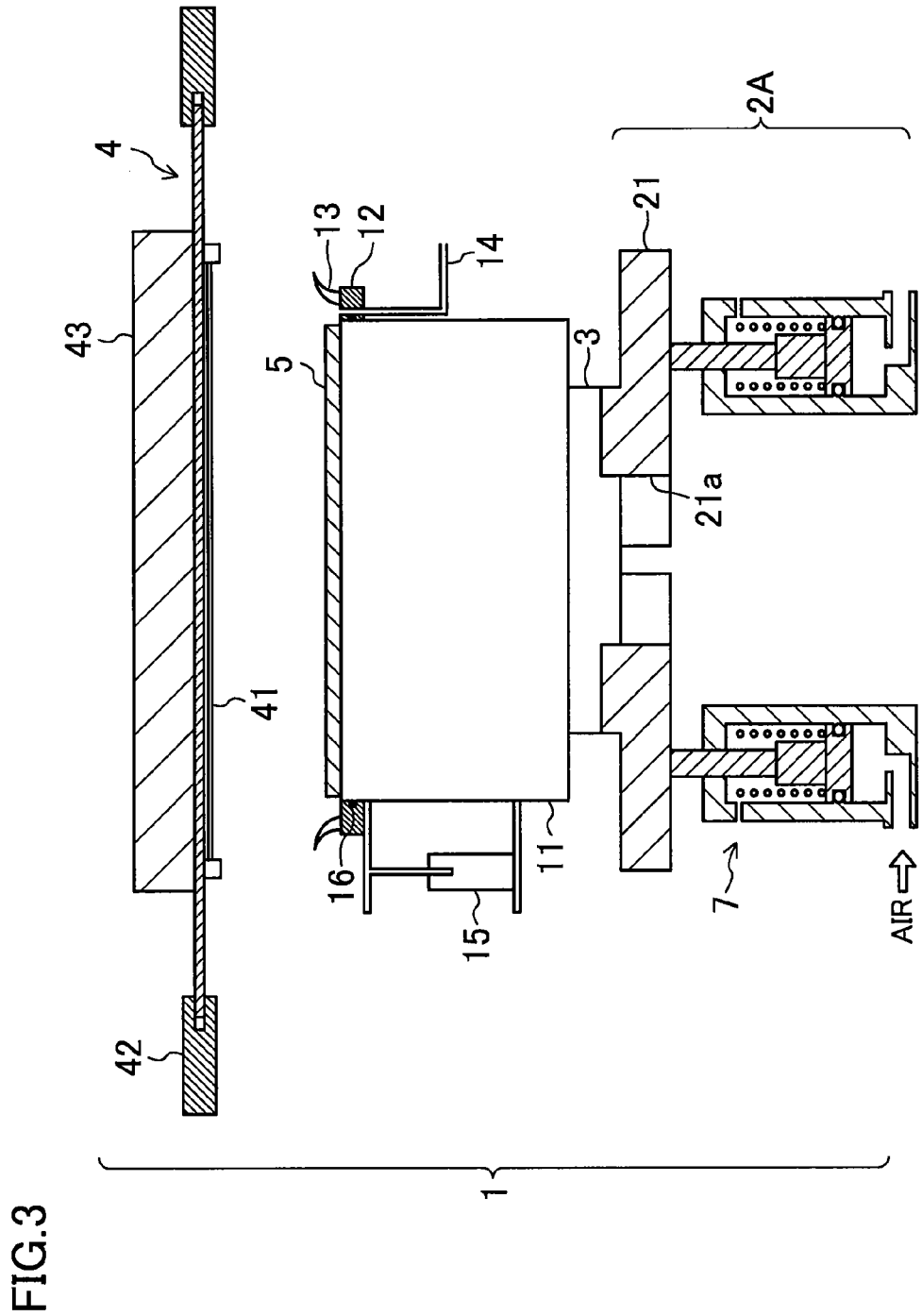
FIG. 3 is a schematic cross sectional view of a wafer holding portion of a wafer inspection device according to a second example embodiment.

Hereinafter, a wafer inspection device according to a second example embodiment will be described with reference to FIG. 3. In FIG. 3, the same components are designated by the same reference characters as those in FIG. 1.

As shown in FIG. 3, the wafer inspection device 1 according to the second example embodiment has the wafer stage 11, the annular seal ring holding member 12 provided on the upper portion of the wafer stage 11 and the outer periphery thereof and containing a rigid material, and the seal ring 13 formed on the seal ring holding member 12 and containing an elastic material.

The seal ring holding member 12 is provided with the internal pressure regulating pipe 14 penetrating the member and a pressure regulating valve (not shown) for regulating the internal pressure is connected to the end opposite to the seal ring holding member 12 in the pressure regulating pipe 14.

Here, as a feature of the second example embodiment, the wafer stage 11 has, on a side surface, a seal ring driving mechanism 15 that can move the seal ring holding member 12 in the direction perpendicular to the principal surface of the probe card 4 attached to the probe card holding mechanism 42. Here, the seal ring driving mechanism 15 is preferably provided at three or more portions around the wafer stage 11. At the farthest position from the probe card 4, the tip portion of the seal ring 13 is preferably positioned below the principal surface of the wafer 5. Thus, interfering with various sensors can be prevented during alignment of the wafer 5.

In a mechanism of driving the wafer stage 11 in the Z direction (direction perpendicular to the wafer holding surface), driving by the stepping motor 25 or the like as in the first example embodiment is not necessarily required. The mechanism may be acceptable insofar as the weight of the wafer stage 11, the wafer 5, or the like can be operated and may be an approaching mechanism portion 2A using an air cylinder 7 or a combination thereof.

The seal ring driving mechanism 15 is preferably a double-acting type air cylinder and, more preferably, the driving air pressure can be adjusted. By suitably adjusting the air pressure, the effect of preventing the seal ring 13 from being excessively strongly pressed against the probe card 4 can be obtained. Also when the wafer 5 is rapidly brought close to or pressed against the probe card 4, the seal ring holding member 12 is returned in the direction in which the seal ring holding member 12 separates from the probe card 4. Therefore, there is an effect that it is prevented that the sealed space formed by the wafer stage 11, the probe card 4, and the seal ring 13 is rapidly compressed to temporarily increase the internal pressure. In contrast, with the reduction in the internal pressure of the sealed space, the seal ring holding member 12 is brought close to the probe card 4. Thus, unlike a former technique of pressing the seal ring 13 against the probe card 4 by mechanical force, the seal ring 13 can be held at the position in equilibrium with a given repulsive force by the seal ring 13.

The seal ring holding member 12 slides on the outer periphery of the wafer stage 11 while maintaining airtightness. Therefore, the inside of the seal ring holding member 12 and the outer peripheral surface of the wafer stage 11 preferably secure airtightness with an elastic material of an O ring 16 or the like. In this case, the surface of the O ring 16 is more preferably processed with a fluororesin, such as Teflon (registered trademark). Thus, the O ring 16 is easy to slide and becomes difficult to wear.

As described above, according to the second example embodiment, since the seal ring holding member 12 holding the seal ring 13 on the upper portion of the wafer stage 11 and on the outer periphery thereof is slidably provided, bringing the probe card 4 close to the semiconductor wafer 5, the formation of the sealed space, and the reduction in the pressure of the sealed space can be individually performed at an independent timing. Therefore, the pressing force by the differential pressure with the atmospheric pressure can be more rapidly obtained.

First Modification of Second Example Embodiment

Figure 4:
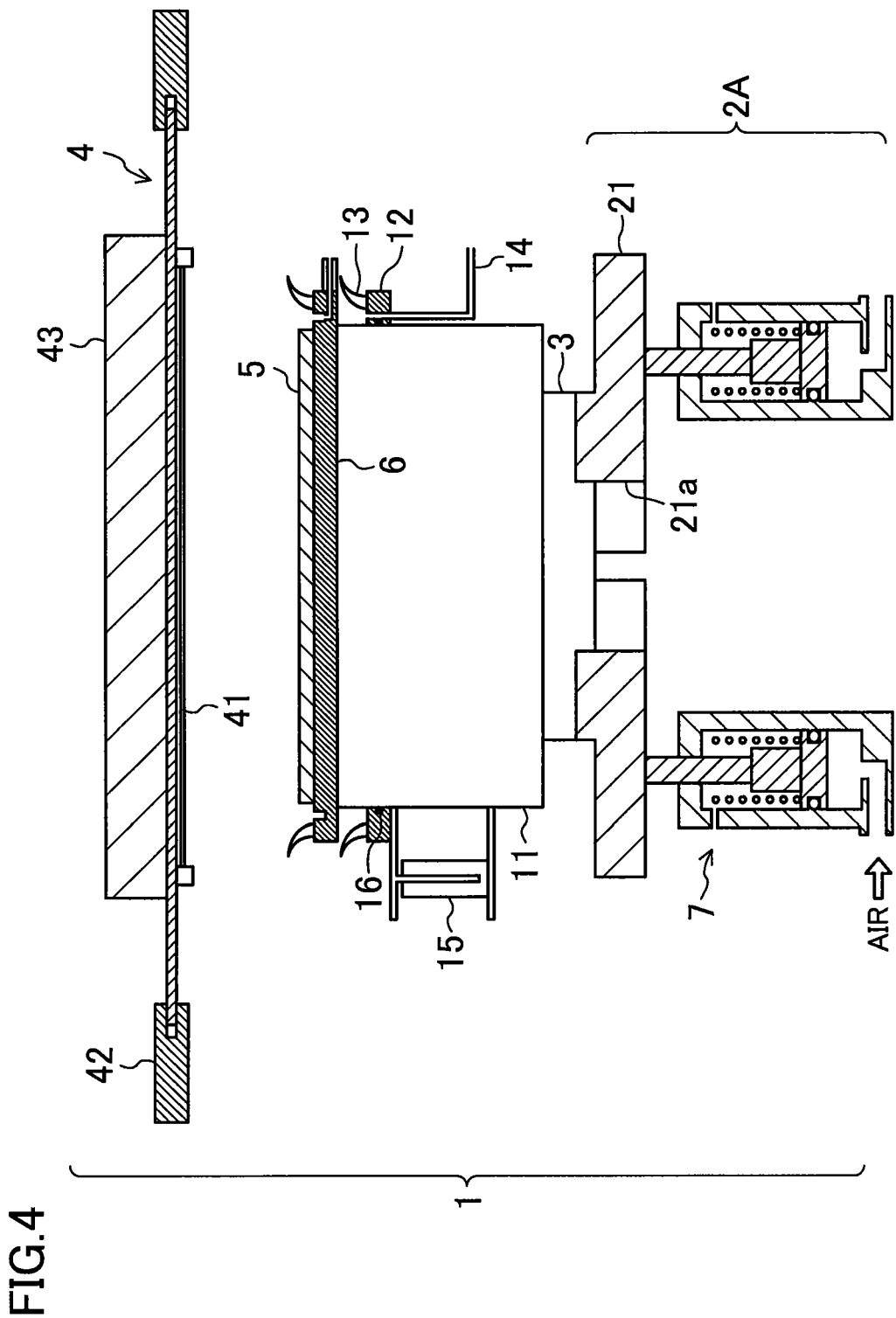
FIG. 4 is a schematic cross sectional view of a wafer holding portion of a wafer inspection device according to a first modification of the second example embodiment.

FIG. 4 shows a first modification of the second example embodiment.

As shown in FIG. 4, in the wafer inspection device 1 according to this modification, a removable wafer tray 6 can be placed on the wafer stage 11.

Here, the seal ring holding member 12 holding the seal ring 13 that is slidably provided can be preferably returned to the position apart from the probe card 4. Thus, after the completion of alignment, the wafer 5 aligned with the probe card 4 can be moved with the wafer tray 6 to another inspection device, and desired inspection can be performed. Therefore, not only that the inspection can be carried out on a higher-functional temperature adjustment system but also that the operating ratio of the inspection device can be increased.

(Semiconductor Wafer Inspection Method)

Hereinafter, a semiconductor wafer inspection method using the probe cards according to the first example embodiment, the second example embodiment, and the modification thereof will be described with reference to FIG. 5.

Figure 5:
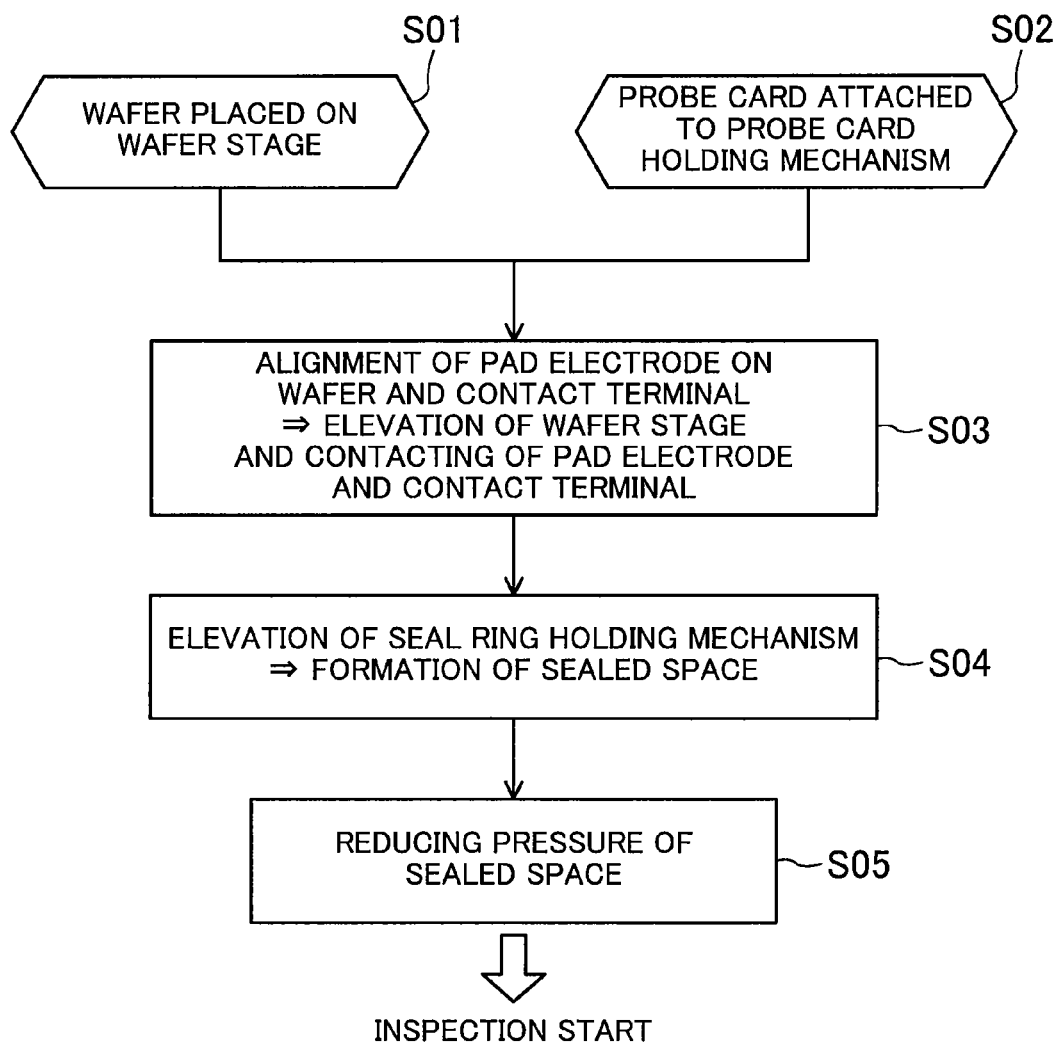
FIG. 5 is a flow chart of a semiconductor wafer inspection method in the case of using the probe cards according to the first and second example embodiments.

As shown in FIG. 5, in a step S01, the wafer 5 is placed on the wafer stage 11. On the wafer 5, a plurality of semiconductor chips, including semiconductor integrated circuits, each to be inspected are formed.

Simultaneously with the step, in a step S02, the probe card 4 is attached to the probe card holding mechanism 42.

Next, in a step S03, a pad electrode (not shown) of each semiconductor chip formed on the wafer 5 and the contact terminal 41 formed on the probe card 4 are aligned. Thereafter, by raising the wafer stage 11, the wafer 5 is brought close to or pressed against the probe card 4 to bring the probe card 4 and the wafer 5 into close contact with each other. Since, in the first example embodiment, the seal ring holding member 12 does not have a driving mechanism, a sealed space is formed by the wafer stage 11, the probe card 4, and the seal ring 13 in the step S03.

Next, in the case of the second example embodiment, in a step S04, by raising the seal ring holding member 12 provided on the periphery of the wafer 5 in the wafer stage 11 and holding the seal ring 13 to be brought close to the probe card 4, the seal ring 13 is brought into close contact with the probe card 4. Thus, a sealed space is formed by the wafer stage 11, the probe card 4, and the seal ring 13.

Next, in a step S05, the pressure of the formed sealed space is reduced. Thus, each contact terminal 41 of the probe card 4 certainly contacts the pad electrode of the wafer 5 to achieve electrical conduction.

Also in the second example embodiment, in the step S03, the seal ring holding member 12 may be elevated to bring the seal ring 13 into close contact with the probe card 4.

In the first example embodiment, the internal pressure of the sealed space may be reduced in the step S03. During the step, it is preferable to gradually increase the degree of reducing the pressure in accordance with the elevation of the wafer stage 11.

Thus, the probe card 4 and the wafer 5 that are mutually aligned and certainly contacted are connected to a tester chip having an inspection function provided on the probe card 4 or a tester provided outside the probe card 4, and desired inspection is performed.

As described above, in the inspection method, the probe card 4 and the wafer stage 11 are mutually drawn near by the differential pressure between the reduced pressure of the sealed space between the wafer 5 and the probe card 4 and the atmospheric pressure. As a result, the contact terminal 41 of the probe card 4 is pressed against the pad electrode of the wafer 5 to achieve mutual electrical connection. During the step, when the wafer stage 11 is pressed against the probe card 4, the force produced by pressing the wafer stage 11 is added to the pressing force generated by the differential pressure with the atmospheric pressure. Thus, a more certain pressing force can be obtained. Thus, after the step, given inspection can be immediately started.

Third Example Embodiment

Hereinafter, a wafer inspection device according to a third example embodiment will be described with reference to the drawings.

First, a probe card for use in the wafer inspection device according to the third example embodiment will be described using FIG. 6.

Figure 6:
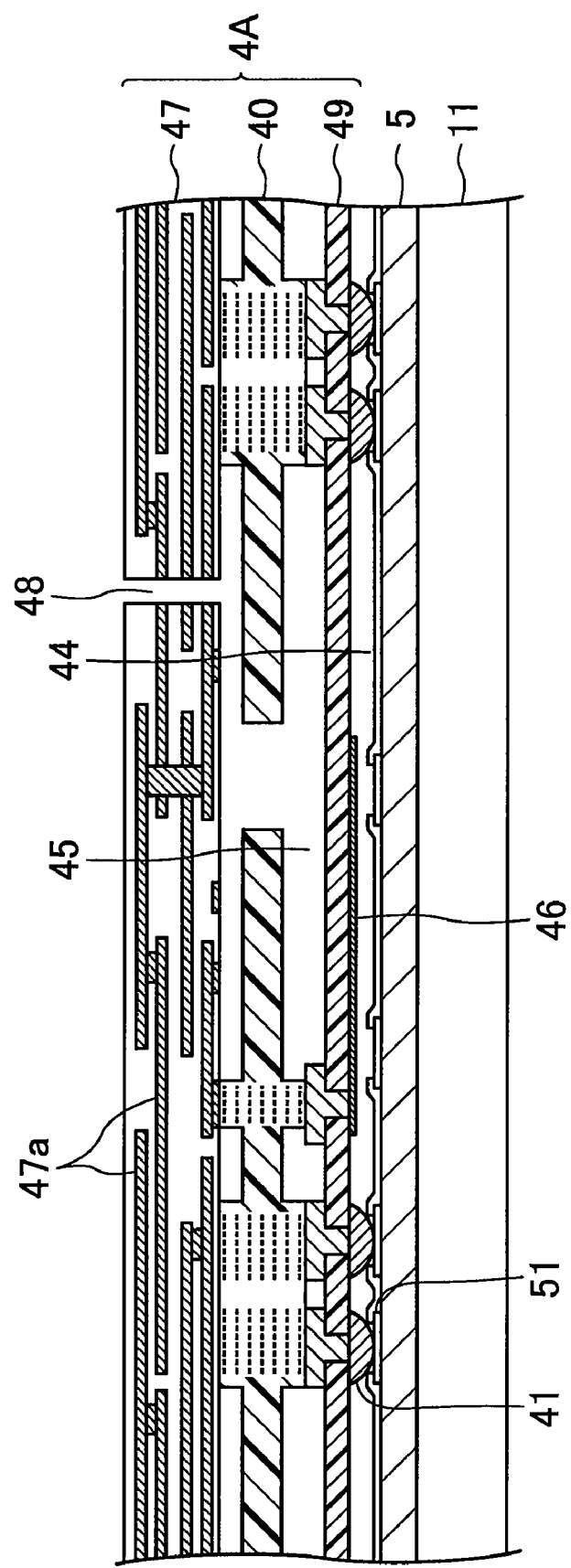
FIG. 6 is a schematic partial cross sectional view of a probe card for use in a wafer inspection device according to a third example embodiment.

As shown in FIG. 6, a probe card 4A to be used in the third example embodiment has a wiring substrate 47 having a plurality of wirings 47a formed therein and a penetration hole 48 penetrating in the front-to-back direction, a thin film substrate 49 having a plurality of contact terminals 41 electrically contacting a plurality of pad electrodes 51 formed on the wafer 5, respectively, and an anisotropically conductive sheet 40 containing an elastic material conducting only in a pressing direction between the wiring substrate 47 and the thin film substrate 49.

Here, on the thin film substrate 49, a non-contact pattern 46 is formed that transmits and receives desired signals by capacitive coupling or inductive coupling to/from a semiconductor integrated circuit formed on the wafer 5. The anisotropically conductive sheet 40 conducts each of the contact terminals 41 and the non-contact pattern 46 and each of the pad electrodes 51 only in the pressing direction.

Between the wiring substrate 47 and the thin film substrate 49, a first sealed space 45 can be formed by closing the penetration hole 48.

Figure 7:
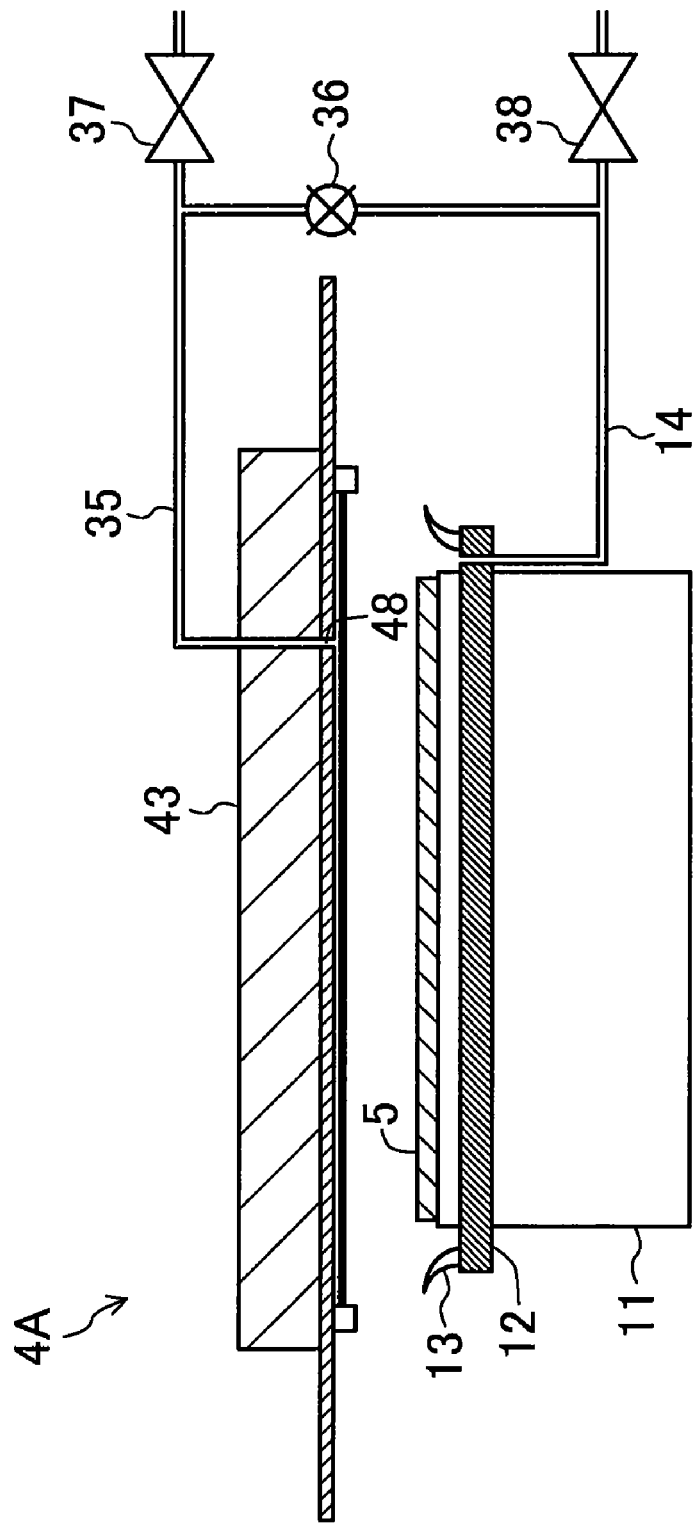
FIG. 7 is a schematic cross sectional view of an internal pressure regulating mechanism of the wafer inspection device according to the third example embodiment.

FIG. 7 shows a pressure regulating mechanism of a wafer inspection device that performs inspection using the probe card 4A described with reference to FIG. 6.

The probe card 4A is provided with a first internal pressure regulating pipe 35 connected to the penetration hole 48 and a first pressure regulating valve 37 connected to the end opposite to the probe card 4A in the first internal pressure regulating pipe 35. The first pressure regulating valve 37 can adjust the first internal pressure in the first sealed space 45 formed between the probe card 4A and the thin film substrate 49.

The seal ring holding member 12 is provided with a second pressure regulating pipe 14 connected to the second sealed space 44 formed by the wafer stage 11, the probe card 4A, and the seal ring 13 and a second pressure regulating valve 38 connected to the end opposite to the seal ring holding member 12 in the second internal pressure regulating pipe 14.

Furthermore, the first internal pressure regulating pipe 35 and the second internal pressure regulating pipe 14 are connected to each other by the pressure short-circuiting switch 36. In general, the pressure short-circuiting switch 36 can conduct the first internal pressure regulating pipe 35 and the second internal pressure regulating pipe 14 by a negative electrical signal to make the pressure each of the pipes the same. The pressure short-circuiting switch 36 can also be made non-conductive by other electrical signals. When made non-conductive, the pressure can be independently adjusted by the pressure regulating valves 37 and 38. Accordingly, it is preferable that the pressure regulating valves 37 and 38 can mutually independently change a given pressure value by electrical signals.

Thus, in the probe card 4A, each of the contact terminals 41 formed on the probe card 4A can be pressed against each of the pad electrodes 51 formed on the wafer 5 and the pressure of the first sealed space 45 can be made higher than the pressure of the second sealed space 44. As a result, the thin film substrate 49 can be expanded to the wafer 5 to contact the non-contact pattern 46. Thus, the electromagnetic coupling in the non-contact pattern 46 becomes strong. Therefore, more stable non-contact communication of electrical signals can be performed.

First Modification of Third Example Embodiment

Figure 8:
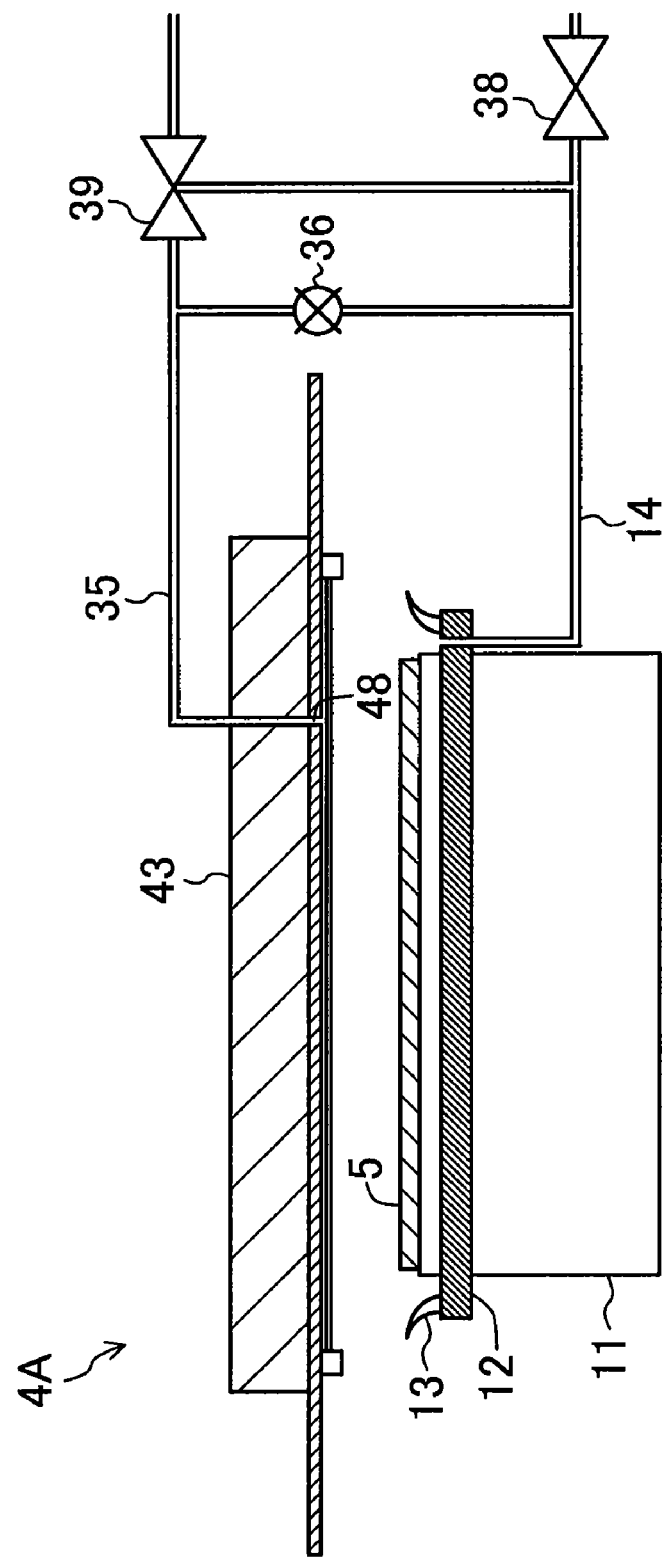
FIG. 8 is a schematic cross sectional view of an internal pressure regulating mechanism of a wafer inspection device according to a first modification of the third example embodiment.

FIG. 8 shows a first modification of the third example embodiment.

The first pressure regulating valve 37 connected to the first pressure regulating pipe 35 shown in FIG. 7 may be a differential pressure regulating valve 39 that regulates the pressure of the second sealed space 44 to have a given differential pressure as shown in FIG. 8.

Thus, the pressure of the first sealed space 45 is automatically adjusted to a preset differential pressure. As a result, even when the preset value of the second pressure regulating valve 38 is changed to be a given contact terminal pressure according to the number of the contact terminals 41 of the probe card 4A, the preset value of the differential pressure regulating valve 39 is not required to be changed with each change in the preset value, and thus artificial operation mistakes can be prevented.

As described above, according to the wafer inspection device and the semiconductor wafer inspection method using the same according to the disclosure, when electrical measurement is performed by contacting a semiconductor wafer on which an integrated circuit is formed, a high load value can be obtained by utilizing a differential pressure with the atmospheric pressure. By combining former pressurization methods, a higher load can be obtained, and the inspection using a probe card having a larger number of terminals can be stably performed. Moreover, the wafer inspection device and the semiconductor wafer inspection method using the same according to the disclosure are also useful for collectively inspecting semiconductor wafers.

What is claimed is:

1. A wafer inspection device, which inspects electrical properties of a semiconductor wafer on which a semiconductor integrated circuit is formed using a probe card, the probe card having a thin film substrate on which an electrode for contact and a non-contact probe pattern using capacitive coupling or inductive coupling are formed and being formed so that the pressure of a first sealed space constituted by mutually facing surfaces of the probe card and the thin film substrate can be controlled;

the wafer inspection device comprising:
  a wafer stage that holds the semiconductor wafer on the upper surface and is movably provided; and
  a mechanism for aligning the probe card and the semiconductor wafer, wherein
  the wafer stage is provided on the outer periphery with a seal ring that forms a second sealed space between the thin film substrate and the semiconductor wafer by bringing the semiconductor wafer close to the probe card or pressing the semiconductor wafer close against the probe card; and
  the pressure of the first sealed space and the pressure of the second sealed space can be independently reduced.

2. The wafer inspection device of claim 1, further comprising:
  a pressure short-circuiting switch mechanism that makes the pressure of the first sealed space and the pressure of the second sealed space the same; and
  a plurality of pressure control valves that independently control each of the first sealed space and second sealed space.

3. The wafer inspection device of claim 2, wherein among the plurality of the pressure control valves, the pressure control valve connected to the first sealed space controls the pressure of the first sealed space in such a manner as to make the pressure of the first sealed space and the pressure of the second sealed space different from each other.

* * * * *